United States Patent
Büttner et al.

(10) Patent No.: US 6,793,905 B1
(45) Date of Patent: Sep. 21, 2004

(54) METHOD FOR PRODUCING HIGH-PURITY HYDROCHLORIC ACID

(75) Inventors: Werner Büttner, Darmstadt (DE);
Martin Hostalek, Darmstadt (DE);
Ching-Jung Kan, Nan-Tou (TW);
Chih-Peng Lu, Lin-kou Village (TW)

(73) Assignee: Merck Patent GmbH, Darmstadt (DE)

( * ) Notice: Subject to any disclaimer, the term of this patent is extended or adjusted under 35 U.S.C. 154(b) by 147 days.

(21) Appl. No.: 10/110,064
(22) PCT Filed: Oct. 4, 2000
(86) PCT No.: PCT/EP00/09678

§ 371 (c)(1),
(2), (4) Date: Apr. 8, 2002

(87) PCT Pub. No.: WO01/25144

PCT Pub. Date: Apr. 12, 2001

(30) Foreign Application Priority Data

Oct. 7, 1999 (DE) .......................... 199 48 206

(51) Int. Cl.⁷ ................................ C01B 7/07
(52) U.S. Cl. ................ 423/488; 423/481; 95/116; 95/132; 95/233
(58) Field of Search ................. 423/481, 488

(56) References Cited

U.S. PATENT DOCUMENTS 3,896,254 A * 7/1975 Berkner ....................... 428/446
4,214,920 A * 7/1980 Amick et al. .................. 438/57
5,407,349 A * 4/1995 Hansotte et al. ............. 432/241
5,632,866 A * 5/1997 Grant ........................... 203/12
5,846,387 A 12/1998 Hoffman et al.
6,050,283 A * 4/2000 Hoffman et al. ............... 137/3
6,132,522 A * 10/2000 Verhaverbeke et al. ....... 134/26
6,165,420 A * 12/2000 Inoko et al. ................. 422/162

FOREIGN PATENT DOCUMENTS

FR     2473898 A    7/1981

OTHER PUBLICATIONS

Patent Abstracts of Japan vol. 1998, No. 14, Dec. 31, 1998 & JP10 231103A (Tsurumi Soda Co Ltd.; Kanto Chem Co, Inc. Sep. 2, 1998).

Patent Abstract of Japan vol. 017, No. 342 (C–1076), & JP 05043203 A (Mitsui Toatsu Chem., Feb. 23, 1993 Inc.

\* cited by examiner

*Primary Examiner*—Ngoc-Yen Nguyen
(74) *Attorney, Agent, or Firm*—Millen, White, Zelano & Branigan, P.C.

(57) ABSTRACT

This invention relates to a novel method, which can be carried out according to industrial standards, for producing high-purity hydrochloric acid with a very low particle content, for use in the production of semiconductors.

17 Claims, 1 Drawing Sheet

METHOD FOR PRODUCING HIGH-PURITY HYDROCHLORIC ACID

Figure 1:
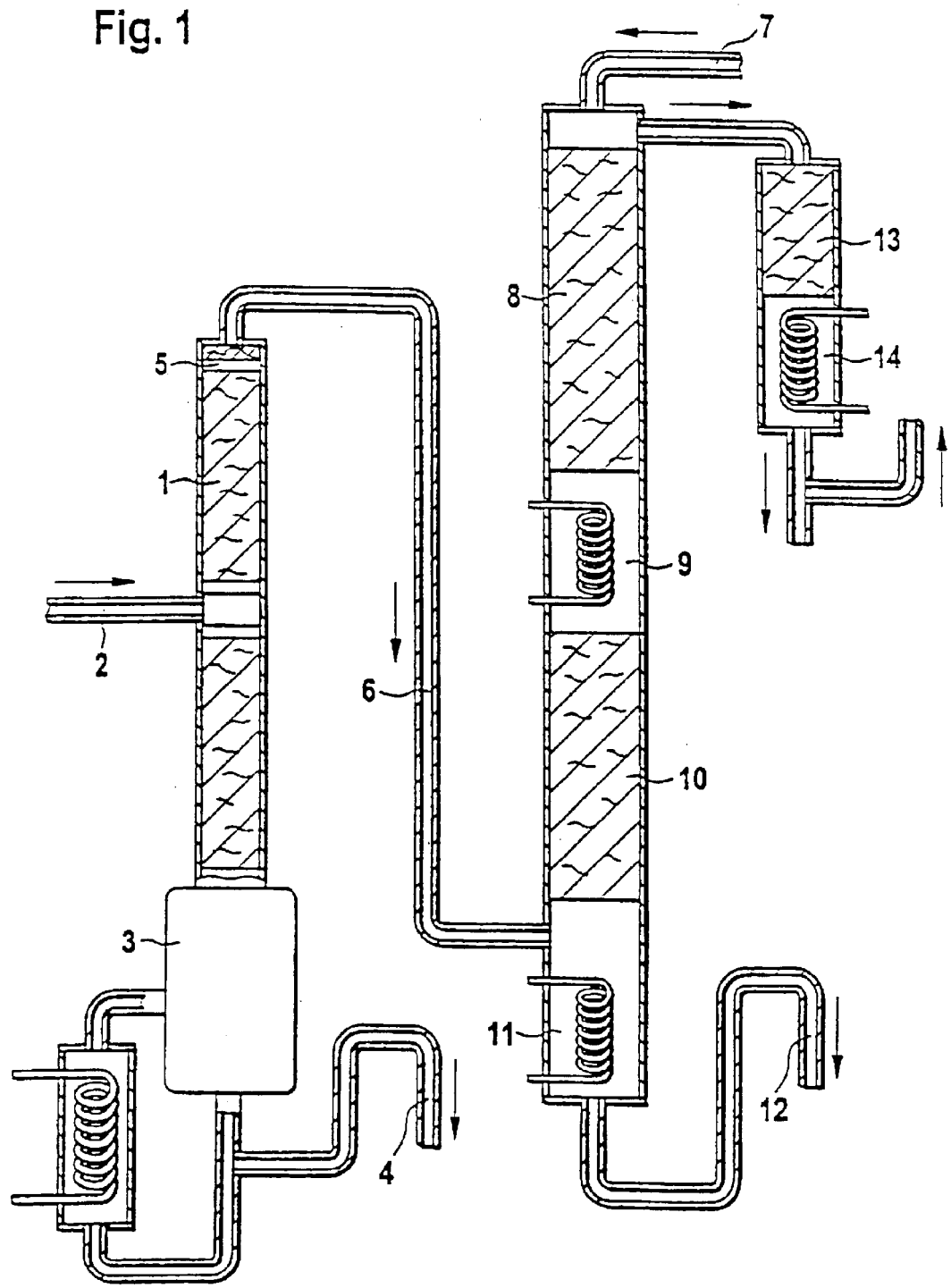

The present invention relates to a novel industrial process for producing high purity, low particle hydrochloric acid for use in semiconductor production.

The hydrogen chloride gas produced by chlorine electrolysis and subsequent burning of chlorine and hydrogen customarily contains impurities which is [sic] very difficult if not impossible to remove from the gas itself. Such impurities include for example arsenic, bromine and volatile organic impurities. Such impurities are difficult to remove even by passing the hydrogen chloride gas into water and subsequently subjecting the resulting hydrochloric acid to an adiabatic distillation.

It is known to produce hydrochloric acid in more or less high purity according to the following different methods:
1. Distillation of 20% hydrochloric acid
2. Distillation of a hydrochloric acid having a hydrogen chloride content of >20% and subsequent absorption of the released hydrogen chloride in the 20% hydrochloric acid distillate
3. Introducing hydrogen chloride gas from compressed gas bottles or a pressurized pipework system conveying hydrogen chloride into a receiver partly filled with water and provided with a cooling means
4. Subboiling distillation These methods (1–4), however, do not permit production of a hydrochloric acid in the requisite purity (methods 1, 2, 3) or requisite concentration (methods 1 and 4).

A method suitable for producing small amounts of high purity hydrochloric acid has hitherto been carried out as follows: 37% hydrochloric acid is heated to expel hydrogen chloride gas. The hydrogen chloride gas is passed through a small retention column to remove droplets and subsequently into a receiver filled with ultrapure water. However, this method is only suitable for producing small quantities of hydrochloric acid, i.e. 10–20 t/year, in a batch operation, since the pressure in the plant will change constantly with increasing fill level. The latter renders continuous operation in the vaporization part of the plant impossible or would necessitate a substantial and complicated technical effort.

It is an object of the present invention to provide a simple and inexpensive way of producing on an industrial scale for use in the semiconductor industry a hydrochloric acid having an extremely low level of cationic, anionic and particulate impurities. In accordance with the intended use, the hydrochloric acid produced should have a hydrochloric acid content of 35–38%.

This object is achieved by a process for producing high purity, low particle hydrochloric acid for use in the semiconductor industry, characterized in that
a) hydrogen chloride gas is expelled from a hydrochloric acid having a hydrogen chloride content of more than 21% by heating,
b) the hydrogen chloride gas is passed through a retention column and a demister, each made of fluorinated or perfluorinated polyolefin, and
c) subsequently dissolved in ultrapure water in an absorption column to form hydrochloric acid.

For concentrating, the invention makes it possible for the hydrogen chloride solution obtained to be withdrawn, cooled and recycled back into the column.

In one embodiment of the invention, HCl-containing water vapour escaping at the top of the absorption column is passed into a packed column and condensed in a downstream column.

The concentration of the hydrogen chloride solution may be determined by conductivity measurement. In a continuous process, this can be done continuously.

The invention provides in particular such a process as operates at low flow resistance, so that it may be carried out at a pressure in the range from atmospheric pressure to a small overpressure of 500 mm of hydrostatic head, preferably <200 mm of hydrostatic head, and constant conditions.

In one embodiment of the process according to the invention, the hydrogen chloride solution is recycled into the absorption column to produce a hydrochloric acid having a concentration of >32%.

In another embodiment of the process according to the invention, the hydrogen chloride solution is recycled into the absorption column to produce a hydrochloric acid having a concentration of 35–38%.

In one version of the process, the hydrochloric acid solution is adjusted to the desired concentration by addition of ultrapure water.

If necessary, any particulate impurities present or formed in the high purity hydrochloric acid may be removed prior to filling in suitable transit containers by filtration using a 1- to 3-stage filter unit.

In particular, in the case of multistep filtration, the filtration can be effected in succession using filters of decreasing pore size between 1.0 and 0.05 $\mu$m.

As stated earlier, combining a vaporization plant with an adiabatic absorption column provides high purity hydrochloric acid having a concentration of 35 to 38% on an industrial scale that meets the requirements for use in the semiconductor industry.

This advantageous result can be obtained by using plant components and feed vessels made of fluorinated or perfluorinated polyolefin materials of construction.

For concentrating, the solution initially obtained in the upper column section (8), which has a hydrogen chloride content of not more than 32%, is cooled in a heat exchanger (9) and then fed to the 2nd column section (10) disposed underneath the upper column section (8) and the cooler (9).

To preclude the product being contaminated via the top of the upper column section (8), through which the water vapour containing HCl gas residues is withdrawn, the escaping gas (HCl and water vapour) is led downwards through a safety column (13) and then condensed in a condenser.

By recycling the hydrogen chloride solution into the lower section of the absorption column (10), it is possible to further increase the concentration of the acid and hence produce a hydrochloric acid having a concentration of more than 32%.

In one version of the process, initially a hydrochloric acid having a hydrogen chloride content above the desired concentration is produced and then by controlled addition of ultrapure water produced in a specific manner to the desired concentration within a very narrow tolerance range (±0.2%) by controlled addition of ultrapure water.

To carry out the process of the invention, a vaporization plant is used to expel hydrogen chloride gas from a hydrochloric acid having a hydrogen chloride content of >20%, preferably having a hydrogen chloride content of 22–40%, by heating at atmospheric pressure or only slightly elevated pressure (0–max. 500 mm hydrostatic head).

Troublesome impurities remain behind in the approximately 20% residual acid to obtain a high purity hydrogen chloride gas.

The hydrogen chloride stream is fed under atmospheric or only slightly superatmospheric pressure initially through a retention column to remove liquid fractions, for example acid traces in the form of liquid droplets, and through a downstream demister under adiabatic conditions into the absorption column and absorbed therein in ultrapure water. To obtain a hydrochloric acid having a concentration of >32%, preferably 35 to 40%, the hydrogen chloride solution descending from the upper column section (8) is cooled and then fed back into the lower column section (10) to concentrate the acid to the desired hydrogen chloride content.

As mentioned above, it is particularly advantageous to use retention columns and demisters made using a fluorinated or perfluorinated polyethylene as material of construction.

The top of the absorption column is supplied with high purity water. The amount of water added is a simple way of controlling the concentration of the high purity hydrochloric acid obtained, and the concentration of the descending acid and hence also the amount of ultrapure water to be added can be monitored by a continuous conductivity measurement at the exit from the 2nd column section.

Tests have shown that the plant system will provide trouble-free processing only when the flow resistances of all components are such that the flow resistance in the overall system is so low that a pressure of 500 mm hydrostatic head, preferably <200 mm hydrostatic head, is not exceeded and maintained virtually constantly in the vaporization section. In other words, the plant can be operated virtually at atmospheric pressure under constant conditions.

The water vapour which escapes at the top of the absorption column and which may still contain very small amounts of HCl gas is protected from the external atmosphere by a packed column (13). The water vapour is condensed in a downstream condenser. To monitor the column system, the concentration of the hydrogen chloride is continuously recorded by conductivity measurement.

To be able to comply with the narrow concentration tolerances stipulated in semiconductor fabrication, it is advantageous for the concentration of the acid exiting from the absorption column to be somewhat higher than required. A downstream buffer cycle is then used to adjust the desired concentration within the requisite tolerance limits by regulated further addition of ultrapure water. In this section of the plant too all components coming into contact with the product are made of fluorinated or perfluorinated polyolefin materials of construction.

Tests on different materials of construction have shown that the choice of suitable materials of construction in particular, not only for the plant but also for the storage and transit systems subsequently used, makes it possible to avoid contamination due to the materials of construction. More particularly, this prevents contamination not only of the pure hydrogen chloride stream but also of the hydrochloric acid. This applies very particularly to the column packings used in the retention column and in the absorption column and to the demister, whose release of ionic contaminants on contact with the product has to be so low that the purity required for the product can be achieved.

The product obtained is preferably collected in storage vessels lined with fluorinated or perfluorinated polyolefin materials. After quality control, hydrochloric acid is released and filled via a clean coupling box into transit containers lined with fluorinated or perfluorinated polyolefin materials or directly into suitable small containers which like the transit containers conform to the DIN ISO regulations.

If necessary, the hydrochloric acid is filtered in a 2- to 3-stage filtration unit before filling into suitable storage vessels to successively remove particles having an average diameter of >1 $\mu$m, >0.2 $\mu$m and >0.1–0.05 $\mu$m.

The sections of the plant which come into contact with the hydrochloric acid or the hydrogen chloride gas or else with the ultrapure water, but also the storage vessels, are constructed of materials which, under the given conditions, release neither ionic nor particulate contaminants. Such materials are materials of construction based on polyolefin, preferably fluorinated or perfluorinated polyolefins such as PVDF, PFA, PTFE and PTFE-TFM. PVDF, PFA and PTFE-TFM are particularly useful not only from qualitative but also from economic aspects.

In contrast to conventional plants for obtaining high purity and low particle hydrochloric acid for use in the semiconductor industry, the inventive plant described herein makes it possible to produce, on a large scale and selectively, hydrochloric acid products having a very low hydrogen chloride content but also having a hydrogen chloride content of up to 40%.

The concentrations of possible cationic contaminants in the hydrochloric acid obtained according to the invention are so low that they are either beyond detection by the analytical methods for hydrochloric acid available at present or are very close to the currently achievable limit of detection, i.e. they are below the detection limit of <0.05 ppb. The level of anionic contaminants is likewise in virtually all cases below the analytical detection limit currently achievable in hydrochloric acid.

More particularly, the process described makes it possible to lower the bromide fraction customarily in hydrochloric acid to a level of <1 ppm.

By way of example, Table 1 reports analytical values determined in a high purity hydrochloric acid produced according to the claimed process.

TABLE 1

Analytical values measured in a plant designed according to the process described and having a capacity of 350 kg of high purity 36% hydrochloric acid

| Values (if no other dimens. is listed) in ppb | |
| --- | --- |
| Assay % | 35–37 |
| Reducing Iodine | <500 |
| Free Chlorine | <100 |
| Ammonium $NH_4$ | <200 |
| Bromide Br | <1000 |
| Nitrate $NO_3$ | <100 |
| Phosphate $PO_4$ | <50 |
| Sulfate $SO_4$ | <50 |
| Resid. of ignition as sulfate | <500 |
| Aluminium Al | <0.1 |
| Antimony Sb | <0.1 |
| Arsenic As | <0.05 |
| Barium Ba | <0.05 |
| Beryllium Be | <0.05 |
| Bismuth Bi | <0.05 |
| Boron B | <0.1 |
| Cadmium Cd | <0.05 |
| Calcium Ca | <0.1 |
| Chromium Cr | <0.05 |
| Cobalt Co | <0.05 |
| Copper Cu | <0.05 |
| Gallium Ga | <0.05 |
| Germanium Ge | <0.05 |
| Gold Au | <0.05 |
| Indium In | <0.05 |
| Iron Fe | <0.1 |
| Lead Pb | <0.05 |
| Lithium Li | <0.05 |
| Magnesium Mg | <0.1 |
| Manganese Mn | <0.05 |
| Molybdenum Mo | <0.05 |
| Nickel Ni | <0.05 |

TABLE 1-continued

Analytical values measured in a plant designed
according to the process described and having a
capacity of 350 kg of high purity 36% hydrochloric acid Values (if no other
dimens. is listed)
in ppb

| | |
|---|---|
| Niobium Nb | <0.05 |
| Palladium Pd | — |
| Platinum Pt | — |
| Potassium K | <0.05 |
| Silicon Si | <5 |
| Silver Ag | <0.05 |
| Sodium Na | <0.1 |
| Strontium Sr | <0.05 |
| Tantalum Ta | <0.05 |
| Thallium Tl | <0.05 |
| Tin Sn | <0.1 |
| Titanium Ti | <0.1 |
| Vanadium V | <0.05 |
| Zinc Zn | <0.05 |
| Zirconium Zr | <0.05 |
| Particles >0.2 μm N/ml | <100 |

FIG. 1 shows the inventive layout of a plant for carrying out the inventive process for producing high purity, low particle hydrochloric acid for use in the semiconductor industry. The plant includes the following elements:
1. Retention column
2. Hydrochloric acid feed
3. Vaporizer
4. Outlet for continuous removal of residual acid
5. Demister
6. Hydrogen chloride gas line
7. Ultrapure water feed
8. Upper section of absorption column
9. Intermediate cooling
10. Lower section of absorption column
11. Cooling
12. Outlet for obtaining the end product
13. Safety column
14. Condensation.

What is claimed is:

1. A process for producing a high purity hydrochloric acid for use in the semiconductor industry, comprising:
   a) expelling hydrogen chloride gas from a hydrochloric acid having a hydrogen chloride content of more than 21% by heating,
   b) passing the hydrogen chloride gas initially at or slightly above atmospheric pressure through a retention column to remove liquid fractions and a demister operating under adiabatic condition, each comprising fluorinated or perfluorinated polyolefin, and
   c) passing the gas directly into an absorption column wherein the gas is subsequently dissolved in an ultrapure water in the absorption column to form hydrochloric acid and a hydrogen chloride solution descending from an upper column section is cooled and then fed back into a lower column section to obtain a hydrochloric acid having a concentration >32%.

2. A process according to claim 1, further comprising passing HCl-containing water vapor escaping at the top of the absorption column into a packed column and condensed condensing in a downstream column.

3. A process according to claim 1, further comprising determining the concentration of the hydrogen chloride solution by conductivity measurement.

4. A process according to claim 1, wherein the process is carried out at a pressure in the range from atmospheric pressure to an overpressure of 500 mm of hydrostatic head, and constant conditions.

5. A process according to claim 1, wherein the hydrogen chloride solution is recycled into an absorption column to produce a hydrochloric acid having a concentration of >32%.

6. A process according to claim 1, wherein the hydrogen chloride solution is recycled into the absorption column to produce a hydrochloric acid having a concentration of 35–38%.

7. A process according to claim 1, wherein the hydrochloric acid solution is adjusted to the desired concentration by addition of the ultrapure water.

8. A process according to claim 1, further comprising removing formed particles prior to filling in a suitable transit container by filtration using a 2- to 3-stage filter unit.

9. A process according to claim 8, wherein filtration is effected using in succession filters of decreasing pore size of 1.0–0.05 μm.

10. A process according to claim 1, wherein the process is conducted at a pressure of less than 200 mm of hydrostatic head.

11. A process according to claim 1, wherein the absorption column comprises fluorinated or perfluorinated polyolefin.

12. A process according to claim 1, wherein the fluorinated or perfluorinated polyolefin is polyvinylidene fluoride, perfluoroalkoxy resin, polytetrafluoroethylene or PTFE-TFM.

13. A process according to claim 1, wherein the hydrochloric acid from c) comprises:

| Values in ppb if no other units are listed | |
|---|---|
| Reducing Iodine | <500 |
| Free Chlorine | <100 |
| Ammonium NH$_4$ | <200 |
| Bromide Br | <1000 |
| Nitrate NO$_3$ | <100 |
| Phosphate PO$_4$ | <50 |
| Sulfate SO$_4$ | <50 |
| Resid. of ignition as sulfate | <500 |
| Aluminium Al | <0.1 |
| Antimony Sb | <0.1 |
| Arsenic As | <0.05 |
| Barium Ba | <0.05 |
| Beryllium Be | <0.05 |
| Bismuth Bi | <0.05 |
| Boron B | <0.1 |
| Cadmium Cd | <0.05 |
| Calcium Ca | <0.1 |
| Chromium Cr | <0.05 |
| Cobalt Co | <0.05 |
| Copper Cu | <0.05 |
| Gallium Ga | <0.05 |
| Germanium Ge | <0.05 |
| Gold Au | <0.05 |
| Indium In | <0.05 |
| Iron Fe | <0.1 |
| Lead Pb | <0.05 |
| Lithium Li | <0.05 |
| Magnesium Mg | <0.1 |
| Manganese Mn | <0.05 |
| Molybdenum Mo | <0.05 |
| Nickel Ni | <0.05 |
| Niobium Nb | <0.05 |
| Palladium Pd | — |
| Platinum Pt | — |
| Potassium K | <0.05 |
| Silicon Si | <5 |

-continued

| Values in ppb if no other units are listed | |
|---|---|
| Silver Ag | <0.05 |
| Sodium Na | <0.1 |
| Strontium Sr | <0.05 |
| Tantalum Ta | <0.05 |
| Thallium Tl | <0.05 |
| Tin Sn | <0.1 |
| Titanium Ti | <0.1 |
| Vanadium V | <0.05 |
| Zinc Zn | <0.05 |
| Zirconium Zr | <0.05 |
| Particles >0.2 μm N/ml | <100. |

14. A process according to claim 1, wherein the hydrochloric acid from c) comprises less than 0.05 ppb for each of As, Ba, Be, Bi, Cd, Cr, Co, Cu, Ga, Ge, Au, In, Pb, Li, Mn, Mo, Ni, Nb, K, Ag, Sr, Ta, Tl, V, Zn, and Zr.

15. A process according to claim 8, wherein the filtration occurs after c).

16. A process according to claim 1, wherein the retention column removes liquid droplets of HCl.

17. A process according to claim 1, wherein the process is conducted at 0–500 mm of hydrostatic head.

* * * * *

UNITED STATES PATENT AND TRADEMARK OFFICE
CERTIFICATE OF CORRECTION

PATENT NO. : 6,793,905 B1
DATED : September 21, 2004
INVENTOR(S) : Buttner et al.

It is certified that error appears in the above-identified patent and that said Letters Patent is hereby corrected as shown below:

Column 5,
Line 63, delete "condensed".

Signed and Sealed this

Nineteenth Day of April, 2005

JON W. DUDAS
*Director of the United States Patent and Trademark Office*